United States Patent
Sakashita

[11] Patent Number: 5,842,169
[45] Date of Patent: Nov. 24, 1998

[54] READ/WRITE CONTROL METHOD AND CIRCUIT FOR A SOUND RECORDING/REPRODUCING DEVICE

[75] Inventor: Yoshikazu Sakashita, Ora-gun, Japan

[73] Assignee: Sanyo Electric Co., Ltd., Osaka, Japan

[21] Appl. No.: 607,858

[22] Filed: Feb. 27, 1996

[30] Foreign Application Priority Data

Feb. 28, 1995 [JP] Japan ........................................ 7-40762
Feb. 28, 1995 [JP] Japan ........................................ 7-40763

[51] Int. Cl.$^6$ ........................................................ G10L 9/00
[52] U.S. Cl. ............................................................... 704/278
[58] Field of Search ................................. 395/2.87, 2.81, 395/2.79, 328; 364/514 R; 704/278, 272, 270, 328

[56] References Cited

U.S. PATENT DOCUMENTS

| | | | |
|---|---|---|---|
| 4,583,131 | 4/1986 | Dakin | 386/8 |
| 4,789,961 | 12/1988 | Tindall | 360/72.1 |
| 4,930,027 | 5/1990 | Steele et al. | 360/70 |
| 5,416,601 | 5/1995 | Wilkinson | 386/95 |
| 5,553,055 | 9/1996 | Yokota et al. | 369/124 |
| 5,566,293 | 10/1996 | Ko et al. | 395/352 |
| 5,574,662 | 11/1996 | Windrem et al. | 364/514 R |
| 5,619,424 | 4/1997 | Cookson et al. | 364/514 R |

*Primary Examiner*—David R. Hudspeth
*Assistant Examiner*—Scott Richardson
*Attorney, Agent, or Firm*—Loeb & Loeb LLP

[57] ABSTRACT

A read/write control circuit for a memory uses a read/write judging circuit which receives read and write request signals and a directional signal indicating whether a sequence of sound data inputted into the memory is in forward (normal) sequence or reversed sequence. The read/write judging circuit refers to the directional signal when both the read and write request signals simultaneously become active such that the read/write judge circuit gives priorty to a write operation in the memory when the sequence is normal by asserting a write enable signal and gives priorty to a read operation in the memory when the sequence is reversed by asserting a read enable signal.

9 Claims, 7 Drawing Sheets

READ/WRITE CONTROL METHOD AND CIRCUIT FOR A SOUND RECORDING/REPRODUCING DEVICE

FIELD OF THE INVENTION

The present invention relates to a sound recording/reproducing device for recording/reproducing audio signals, and particularly to read/write control of a memory used for storing sound data.

BACKGROUND OF THE INVENTION

Many video tape recorders (VTRs) developed recently are capable of reproducing natural sounds even when a video tape is scanned at a speed higher than normal. This function is called "digest play". In a VTR having the digest play function, sounds are reproduced at the normal speed even when the tape is scanned at a speed three or five times higher than normal. Sound data reproduced at the higher speed are first written into a memory, and then the sound data stored in the memory are read out at the normal speed to reproduce normal sounds.

Since the reading speed is lower than the writing speed, only a readable amount of the reproduced sound data is stored in the memory, and the rest is abandoned. When the video tape is scanned at a five-fold speed, sound data for 15 seconds at the normal speed are reproduced for 3 seconds only sound data for 0.6 seconds out of the 3 seconds are written into the memory, and read out for 3 seconds at the normal speed to reproduce sounds. The sound data for the other 12 seconds are abandoned.

In the above described digest play function, address orienting directions in the memory (directions in which read and write addresses of the memory are cycled through) are made the same, for instance from a lower address to a higher, when the reproducing direction in the VTR is normal. The write operation is always carried out before the read operation because the writing speed is higher than the reading speed. When the read and write operations are simultaneously requested, the write operation is carried our prior to the read. Sounds based on the data read from the memory are continuously reproduced.

On the other hand, when the reproducing direction in the VTR is reverse, the sequence of the sound data inputted into the memory is reverse. Therefore, the address orienting direction for the reading needs to be reverse to that in the writing. When the sound data are written from a lower address to a higher address, they are read from the higher to the lower. This realizes sounds reproduced in the same sequence as pronunciation.

The address orienting direction needs to be changed in response to the sequence of inputted sound data. Since the address orienting directions for the reading and writing are opposite to each other, the reading and writing are simultaneously requested at a certain address.

The progress of read address and write address in high speed reverse reproduction is shown in FIG. 6. This represents an example of the reverse reproduction at a five-fold speed. The horizontal and vertical axes show time and memory addresses, respectively. The process of the read address is shown by solid lines, and that of the write address by broken lines.

As shown in FIG. 6, the memory write is carried out from a lower address of the memory to a higher address for periods A, B and C. The memory read is always carried out continuously from a higher address to a lower address. In this example, the length of the writing periods B and C is set to one fifth the length of period D, for which the read address from the lowest address (LSB) of the memory to the highest (MSB) is completed.

For the period A, sound data obtained by the high speed reverse reproduction are sequentially written from an address P to the lowest address of the LSB. The sound data written for the period B are successively read from the lowest address to a higher address for D1 of a period D. When the read address reaches a point c, the memory write is newly begun from the point c (address Q) to the lowest address. Simultaneously with the memory write, the reading of the rest of the data written for the period A is continuously carried out from the address Q to a higher address. When the write address and read address simultaneously reach a point d, the memory write is finished. After the point d, the sound data written for a period B2 are successively read. Hereafter, similar operations are continued.

Near the point c at which the reading and writing are simultaneously requested, the sound data written for the period A are continuously read. At the point c, new data are overwritten and the sound data which is previously written at a point h, and which is to be normally read is not read, when the writing is still carried out prior to the reading. The discontinuity of the sound data occurs at the point c, leading to noise in the reproduced sound. This phenomenon arises at a point of a, b, d, e or f at which the reading and writing are simultaneously requested at a single address.

SUMMARY OF THE INVENTION

The object of the present invention is to provide a read/write control method for eliminating discontinuities generated by simultaneous requests for reading and writing of sound data, and to provide a read/write control circuit for eliminating such discontinuities.

According to a method provided by the present invention, address orienting directions for reading and writing in a memory are set to be the same when the sequence of inputted sound data is normal, and they are set to be opposite to each other when the sequence is reverse. In addition, when read and write requests simultaneously arise in the memory, priority is given to the write operation with the sequence normal, and to the read operation with the sequence reverse.

When the sequence is normal, the write operation is always carried out first by making the write operation prior to the read. This does not cause any problems. In contrast, when the sequence is reverse, the read operation is carried out prior to the write at an address where the read and write operations are simultaneously requested. The sound data read at the address becomes continuous with those near the address. This solves the discontinuity problem.

A read/write control circuit provided by the present invention actually controls the memory access according to the above described method. The read/write control circuit has a read/write judging circuit. A direction signal indicating whether the sequence of sound data inputted to the memory is normal or reverse, a read request signal, and a write request signal are inputted into the read/write judging circuit. The read/write judging circuit refers to the direction signal when both read and write request signals simultaneously become active. When the sequence is normal, the read/write judging circuit carries out the writing prior to the reading in the memory, and asserts a write enable signal. When the sequence is reverse, the read/write judging circuit carries out the reading prior to the writing in the memory, and asserts a read enable signal.

The read/write control circuit decides an output sequence of the read and write enable signals in response to their priority, and successively asserts them according to the decided sequence when the reading and writing are simultaneously requested. The read/write control circuit has an acknowledge signal generating circuit for asserting a write acknowledge signal to a requester immediately after the acknowledge signal generating circuit receives the write request signal from the requester, and a prohibit signal generating circuit for asserting a prohibit signal which disables the acknowledge signal generating circuit from asserting the write acknowledge signal during a period when the write operation continues after its initiation.

In this feature according to the present invention, the write acknowledge signal is asserted to an AD converter immediately after the acknowledge signal generating circuit receives the write request signal from the requester. The requester is permitted to generate the write request signals with very high frequency. Since a further write request signal is not received before finishing the present write operation, the present data is not overwritten with other data during the write operation, and so the continuity of sound data is maintained.

DESCRIPTION OF THE PREFERRED EMBODIMENT

Figure 3:
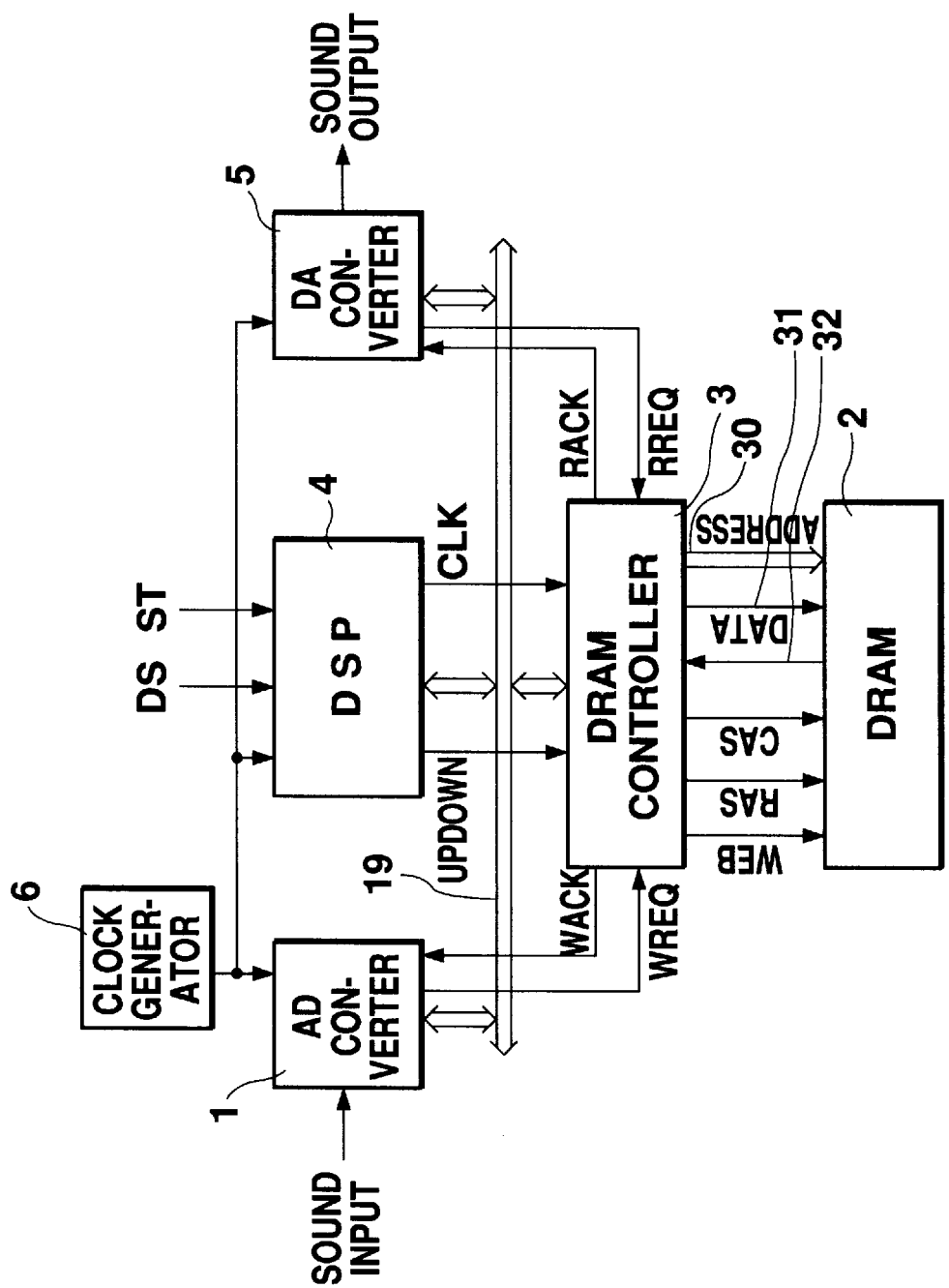
FIG. 3 shows a block diagram of the whole structure of a sound recording/reproducing device including a DRAM controller in accordance with a preferred embodiment of the present invention.

A simplified block diagram of a sound recording/reproducing device including a read/write control circuit provided by the present invention is shown in FIG. 3. The device comprises an AD converter 1 for converting an input analog sound signal to digital sound data, a DRAM 2 for storing the converted sound data, a DRAM controller 3 connected to the DRAM 2 for controlling reading and write operations in the DRAM 2, a DSP 4 for controlling the whole sound recording/reproducing device, a DA converter 5 for converting sound data read from the DRAM 2 to an analog sound signal and a clock generator 6 for outputting reference clock signals to the respective sections of the device.

A write request signal WREQ and read request signal RREQ for the DRAM 2 are outputted to the DRAM controller 3 from the AD converter 1 and DA converter 5, respectively. When the read and write operations are finished, a write acknowledge signal WACK and read acknowledge signal RACK are sent back to the AD converter 1 and DA converter 5, respectively. The AD converter 1 and DA converter 5 reset the write request signal WREQ and read request signal RREQ in response to the acknowledge signals, respectively.

Speed information ST, indicating at what speed a video tape is scanned in high speed reproduction, and direction information DS, indicating whether the reproducing direction is normal or reverse, are inputted to the DSP 4 from outside. The DSP 4 outputs a direction signal UPDOWN corresponding to the direction information and indicating the direction of the sequence of input sound data to the DRAM controller 3. The DSP 4 also outputs speed information ST to the AD converter 1. The AD converter 1 changes a sampling frequency in response to the speed information ST, and outputs the write request signal WREQ at a timing corresponding to the speed information ST. The DSP 4 outputs a clock signal CLK to the DRAM controller 3.

Figure 1:
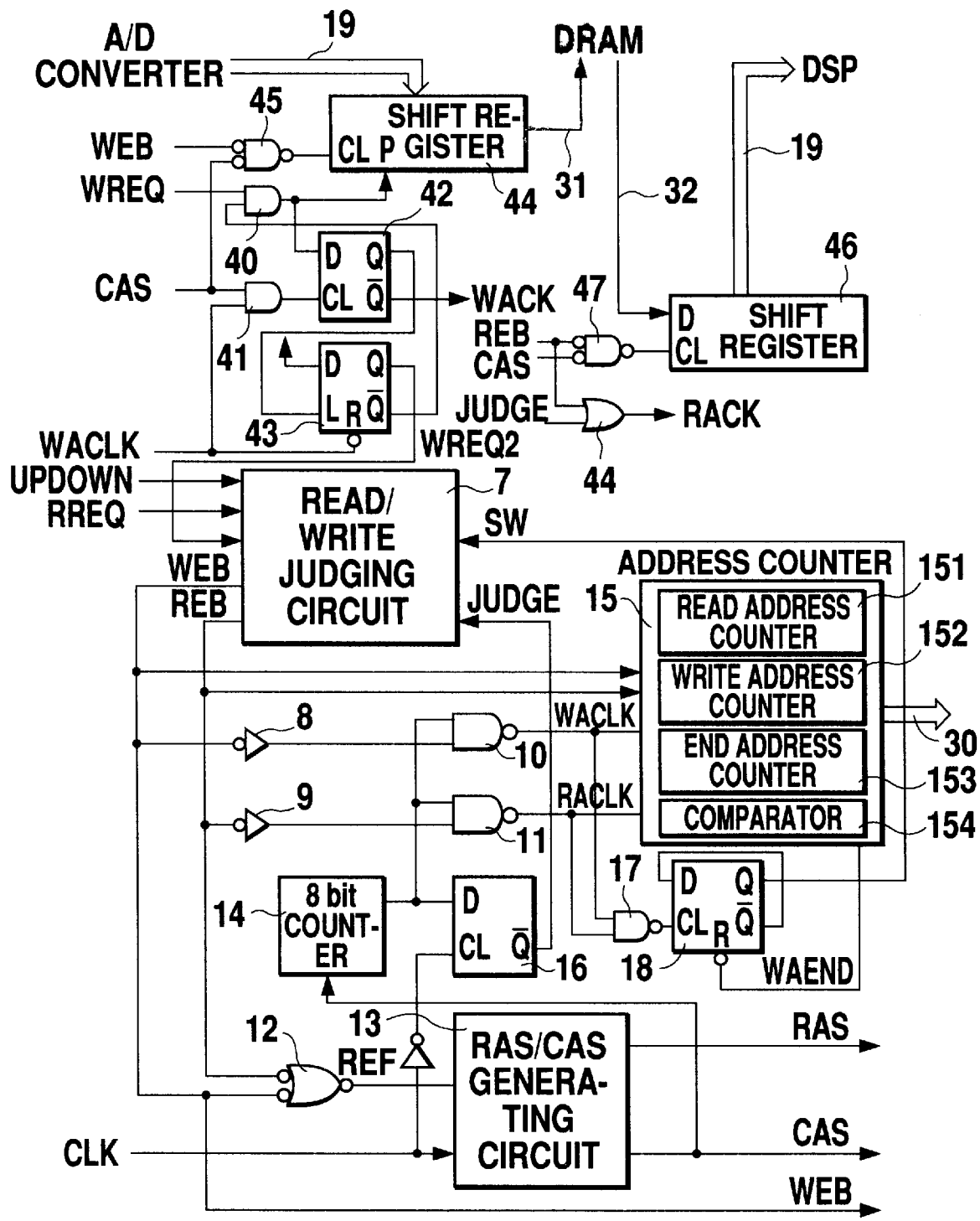
FIG. 1 shows a block diagram of a DRAM controller in accordance with a preferred embodiment of the present invention.

A detailed circuitry of the DRAM controller 3 is described by referring to FIG. 1. A second write request signal WREQ2 internally generated based on the write request signal WREQ from the AD converter 1, the read request signal RREQ from the DA converter 5, the direction signal UPDOWN from the DSP 4, a switching signal SW generated internally and a timing judging signal JUDGE are inputted into the DRAM controller. A read/write judging circuit 7 for outputting a write enable signal WEB and read enable signal REB, are both active at the low level (active low), and are included in the DRAM controller 3. These enable signals are inputted to NAND gates 10 and 11 via inverters 8 and 9. The enable signals are inputted to an AND gate 12, which outputs a signal REF. The signal REF and clock signal CLK from the DSP 4 are inputted to a RAS/CAS generating circuit 13. In the DRAM 2, refresh is carried out in a CAS-before-RAS manner. The RAS/CAS generating circuit 13 causes a CAS signal transition from the higher level to the lower before a RAS signal transition, and the DRAM 2 is refreshed, when the signal REF is at the higher level H. The read or write operation is carried out when the signal REF is at the low level L. This circuit sends RAS/CAS signals to the DRAM 2 at a predetermined timing to realize the respective operations. In addition, the write enable signal WEB is outputted to the DRAM 2 without alteration.

An 8 bit counter 14 which counts the CAS signals and generates an output signal per 8 counts is also included in the DRAM controller 3. The output signal of the 8 bit counter 14 is inputted to the NAND gates 10 and 11. Clock signals WACLK and RACLK which have passed through the NAND gates 10 and 11 are inputted to an address counter 15. The output signal of the 8 bit counter 14 is applied to the D terminal of a D flip-flop circuit 16. An inverse signal of the clock signal CLK is applied to the clock terminal of the D flip-flop circuit 16. An inverse Q output signal is used as a timing judging signal JUDGE. The clock signals WACLK and RACLK are inputted to a NAND gate 17. The output signal of the NAND gate 17 is applied to the clock terminal of a D flip-flop circuit 18 which has the inverse Q output signal fed back to its own D terminal. An output signal of the D flip-flop circuit 18 is used as a switching signal SW.

An address counter 15 has a read address counter 151, write address counter 152, end address counter 153 and a comparator 154 for comparing the content of the write address counter 152 with that of the end address counter 153, and outputting a coincidence signal WAEND. The signal WAEND is inputted to the D flip-flop circuit 18 as a reset signal. The direction signal UPDOWN and enable signals WEB and REB are inputted to the address counter 15. The counting direction of the write address counter 152 is changed in response to the direction signal UPDOWN. In addition, the value of either the address counter 151 or 152 is sent to an address bus 30 in response to the enable signals WEB and REB.

The DRAM controller 3 also has an AND gate 40 which has the write request signal WREQ inputted to one of its terminals, an AND gate 41 which has the CAS signal and clock signals WACLK inputted, a D flip-flop circuit 42 which has an output signal of the AND gate 40 inputted to its D terminal and an output signal of the AND gate 41 inputted to its clock terminal, and a latch circuit which has a constant level H inputted to its D terminal. A Q output signal of the D flip-flop circuit 42 is inputted as a latch pulse signal, its own inverse Q output signa is fed back to the other terminal of the AND gate 40, and the clock signal WACLK resets it. An inverse Q output signal of the D flip-flop circuit is outputted to the AD converter 1 as a write acknowledge signal WACK. A Q output signal of the latch circuit 43 is used as a second write request signal WREQ2. The read enable signal REB and timing judging signal JUDGE are inputted to an OR gate 49, and an output signal of the OR gate 49 is outputted to the DA converter 5 as a read acknowledge signal RACK.

A shift register 44 for converting parallel data, written in the form of 8 bits, to serial data is included in the DRAM controller 3 in order to send data to the DRAM 2 during the write operation. An output signal of an OR gate 45 to which the write enable signal WEB and the CAS signal are inputted is applied to the clock terminal of the shift register 44. An output signal of the AND gate 40 is applied to the preset terminal P of the shift register 44. Another shift register 46 is included to send data to the DSP 4 during the read operation. An output signal of an OR gate 47 to which the read enable signal REB and CAS signal are inputted is applied to the clock terminal CL of the shift register 46. Data from a data line 32 are applied to the D terminal of the shift register 46.

Figure 2:
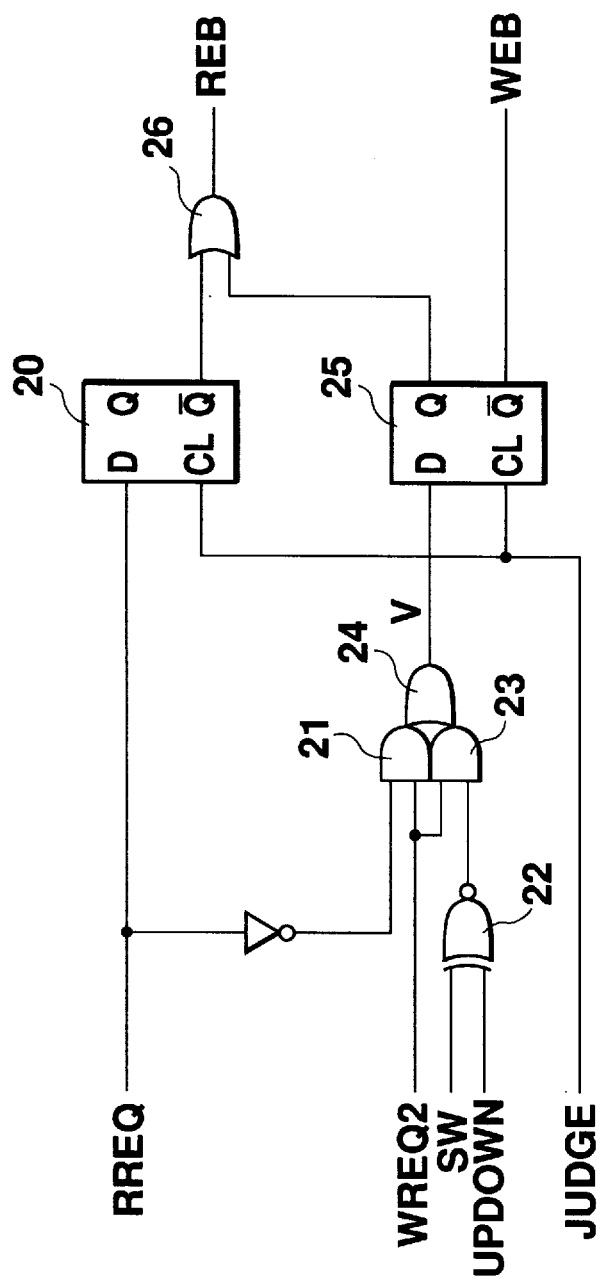
FIG. 2 shows an example of the structure of a read/write judging circuit in accordance with a preferred embodiment of the present invention.

A read/write judging circuit 7 is exemplified in FIG. 2. The read/write judging circuit 7 has a D flip-flop circuit 20 which has the read request signal RREQ applied to its D terminal and the timing judging signal JUDGE applied to its clock terminal, an AND gate 21 to which an inverted read request signal and second write request signal WREQ2 are applied, an EX-NOR gate 22 to which the switching signal SW and direction signal UPDOWN are applied, an AND gate 23 to which an output signal of the EX-NOR gate 22 and the second write request signal WREQ2 are applied, an OR gate 24 to which output signals of the AND gates 22 and 23 are applied, a D flip-flop circuit 25 which has an output signal of the OR gate 24 applied to its D terminal and the timing judging signal JUDGE applied to its clock terminal, and an OR gate 26 to which a inverted Q output signal of the D flip-flop circuit 20 and a Q output signal of the D flip-flop circuit 25 are applied. An output signal of the OR gate 26 is used as the read enable signal REB and a inverted Q output signal of the D flip-flop circuit 25 is used as the write enable signal.

Figure 4:
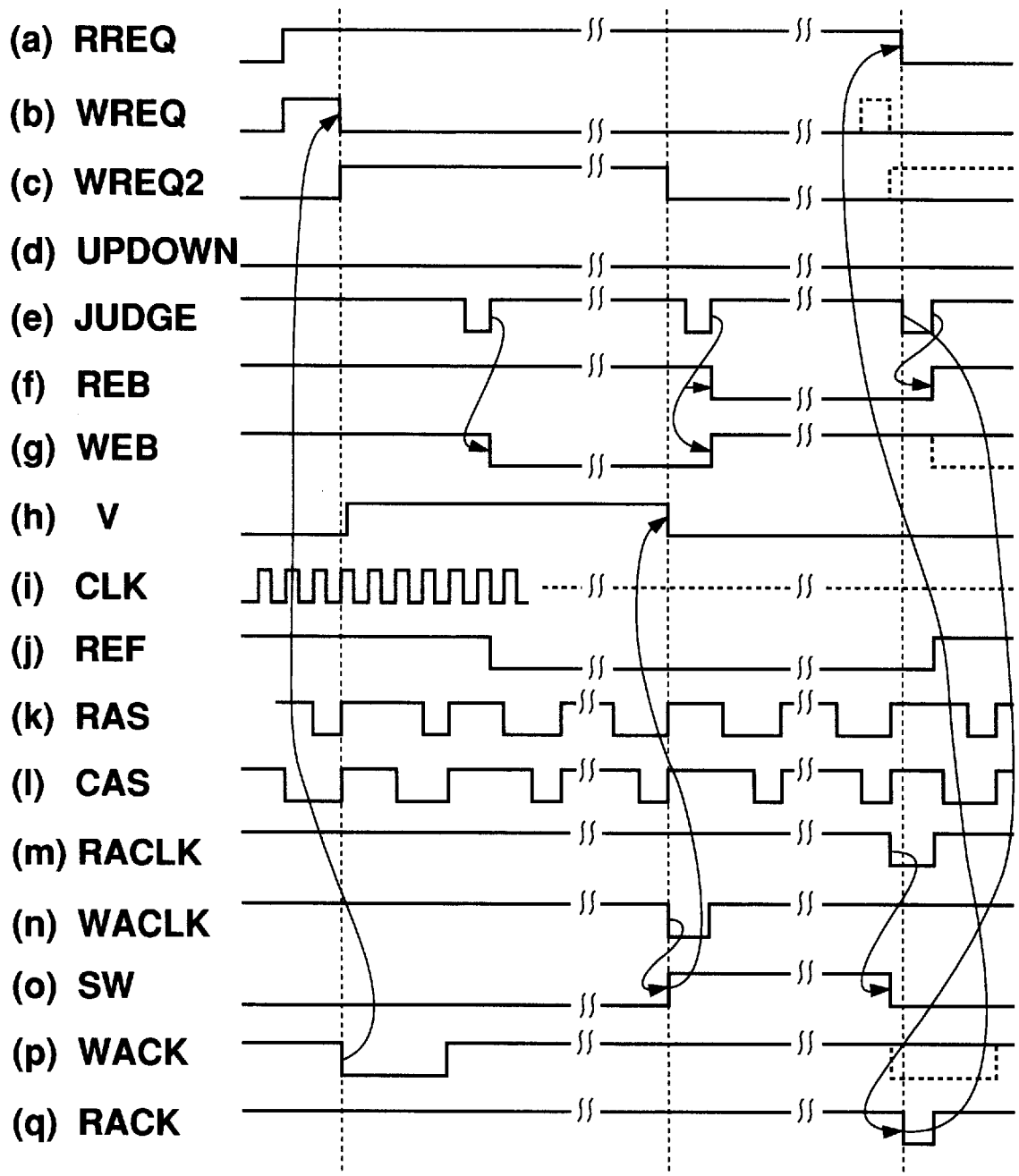
FIG. 4 shows a timing chart for describing the operation in reproduction in the normal direction in accordance with a preferred embodiment of the present invention.
Figure 5:
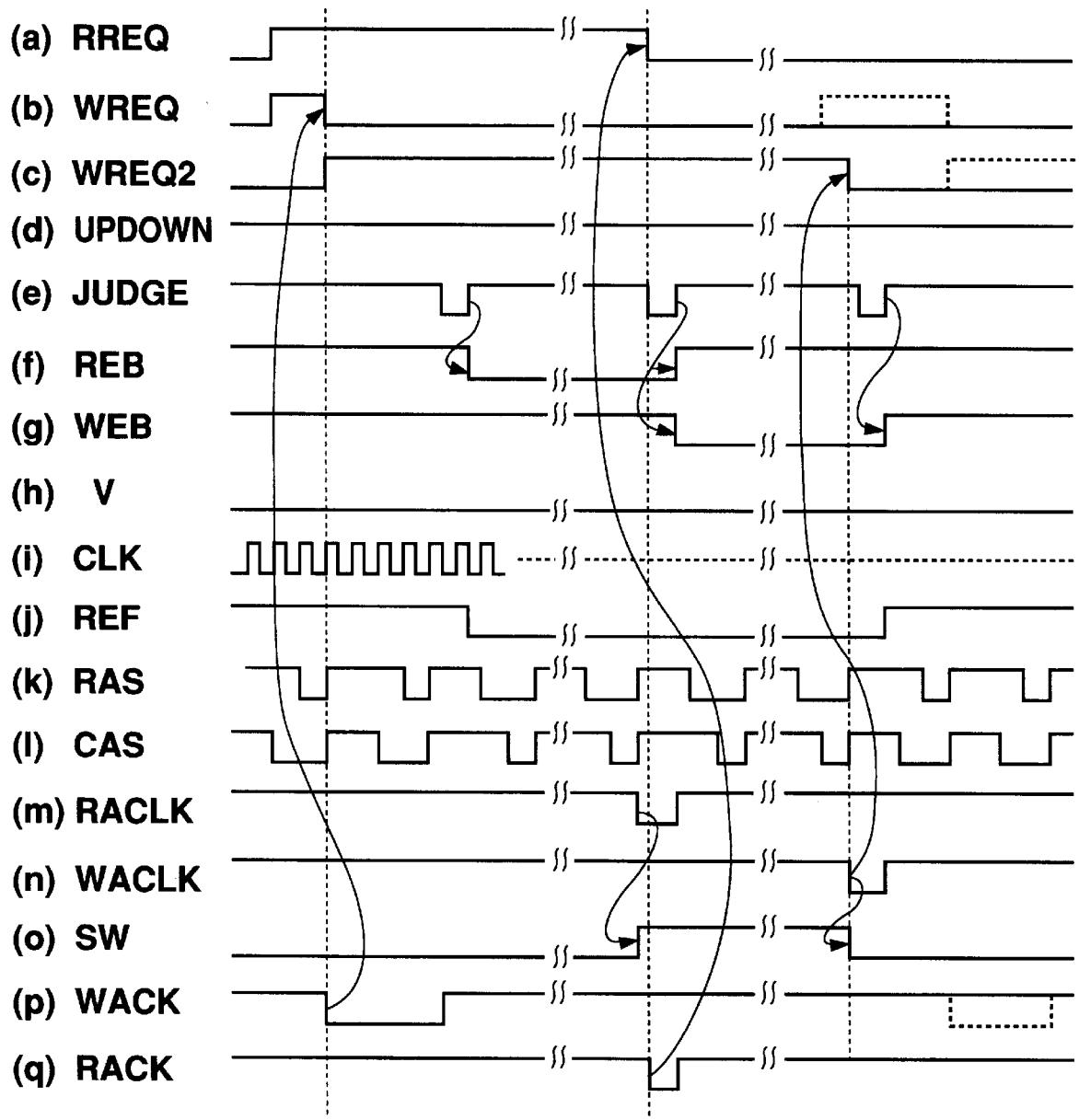
FIG. 5 shows a timing chart for describing the operation in reproduction in the reverse direction in accordance with a preferred embodiment of the present invention.

The operation of this embodiment is described by referring to timing charts shown in FIGS. 4 and 5. Before access to the DRAM 2, the DSP 4 sets the first read address, first write address and end address in the read address counter 151, write address counter 152 and end address counter 153, respectively.

[1] Normal Direction

When the read request signal RREQ and write request signal WREQ are simultaneously at H level (FIG. 4 (a), (b)), both the read and write enable signals REB and WRB are at H level in the read/write judging circuit 7 of the DRAM controller 3, because the inverse Q output signals of the D flip-flop circuits 20 and 25 are at H level before applying the timing judging signal JUDGE. The output signal REF of the AND gate 12 is at H level. Therefore, the RAS/CAS signal is outputted in a predetermined timing for refresh.

The output signal of the AND gate 40 becomes H level immediately after the write request signal WREQ is changed to the higher H. When the level of the CAS signal is changed to H level (FIG. 4 (l)), an H level signal is inputted to the D flip-flop circuit 42, and then the output signal of the D flip-flop circuit 42 is inputted to a latch circuit 43 as a latch pulse. The output signal of the latch circuit 43, the second write request signal WREQ2, is at H level, as shown in FIG. 4 (c). The inverted Q output signal of the D flip-flop circuit 42, the write acknowledge signal WACK, is at L level, as shown in FIG. 4 (p). The write acknowledge signal WACK is inputted to the AD converter 1 to reset the write request signal WREQ, as shown in FIG. 4 (b).

When the direction signal UPDOWN is at L level (FIG. 4 (d)), indicating that the reproducing direction is normal, the switching signal SW remains at L level as in the initial state (FIG. 4 (o)). The output signal of the EX-NOR gate 22 is at H level. The read request signal RREQ and second write request signal WREQ2 are at H level, as described above. The output signal of the AND gate 21 is at L level, and that of the AND gate 23 is at H level. Therefore, the output signal V of the OR becomes H level (FIG. 4 (h)), and signals at H level are applied to the D terminals of the D flip-flop circuits 20 and 25.

When the timing judging signals JUDGE are periodically applied to the D flip-flop circuits 20 and 25 (FIG. 4 (e)), the inverted Q output signal of the D flip-flop circuit 20 is at L level and the Q output signal of the D flip-flop circuit 25 is at H level in response to the rising edge of the timing judging signal JUDGE. The read enable signal REB, the output signal of the OR gate 26, remains at H level, as shown in FIG. 4 (f). The inverted Q output signal of the D flip-flop circuit 25, write enable signal WEB, gets at L level, as shown in FIG. 4 (g).

When the write enable signal WEB is at L level, the output signal REF of the AND gate 12 becomes L level. The RAS/CAS generating circuit 13 generates the RAS/CAS signals in a predetermined timing, as shown in FIG. 4 (k), enabling accessing the DRAM 2. At this time in the address counter 15, the content of the write address counter 152 is outputted in response to the write enable signal WEB being at L level. The first write address set by the DSP 4 is outputted to the address bus 30.

When the write request signal WREQ becomes H level, the output signal of the AND gate 40 becomes H level. Consequently, parallel data written in the form of 8 bits and sent from the AD converter 1 to the address bus 30 are preset in the shift register 44. The CAS signals are inputted to the shift register 44 via the OR gate 45 as clock signals during a period when the write enable signal WEB is at L level. The data is shifted via the clock signals, sent to the DRAM 2 through a data line 31 and written into the DRAM 2.

Thus, priority is given to the write operation in the DRAM 2. In the write operation, the 8 bit counter 14 outputs a pulse when a data of one byte is formed in the DRAM 2 by CAS signals outputted eight times. The output pulse is inverted by the NAND gate 10, then inputted to the address counter 15 as the clock signal WACLK (FIG. 4 (n)), and then the corresponding write address counter 152 is incremented. In the next write operation, 8 bit data are written into an address which has been incremented. When the content of the write address counter 152 coincides with that of the end address counter 153 after proceeding with the write operation, the comparator 154 outputs the coincidence signal WAEND. The D flip-flop circuit 18 is reset by the coincidence signal WAEND, and then the output signal of the D flip-flop circuit 18, switching signal SW, becomes L level, as in the initial state.

At the falling edge of the clock signal WACLK, the inverted Q output signal of the D flip-flop circuit 18 bed back to itself. Consequently, the switching signal SW becomes H level (FIG. 4 (o)). The latch circuit 43 is reset by the clock signal WACLK, and then the second write request signal WREQ2 becomes L level. When the switching signal SW is at H level, the output signal of the EX-NOR gate 22 becomes L level. At this time, the second write request signal WREQ2 is also at L level, and then the output signals of both AND gates 21 and 23 are at L level. Consequently, the output signal V of the OR gate 24 is at L level. When the timing judging signal JUDGE is applied in this state, the output signal of the D flip-flop circuit 25 (write enable signal WEB) becomes H level to finish the write operation. The inverted Q output signal of the D flip-flop circuit 20 at L level is inputted to the OR gate 26, and the level of the output signal (read enable signal REB) is changed to L.

When the level of the read enable signal REB is changed to L, the content of the read address counter 151 is sent onto the address bus 30. Simultaneously, the RAS/CAS generating circuit 13 generates the RAS and CAS signals, as in the write operation. The read operation which has been awaiting completion is carried out in the DRAM 2. The read data are inputted to the shift register 46 through the data line 32. The CAS signals are inputted to the shift register 46 through the OR gate 47 as clock signals during a period when the read enable signal REB is at L level. The data are serially inputted to the shift register 46 under control of the clock signal.

During this read operation, the 8 bit counter 14 generates a pulse when it reads one byte of data from the DRAM 2 by asserting CAS signals eight times. The pulse is inverted by the NOR gate 11, and inputted to the address counter 15 as the clock signal RACLK (FIG. 4 (m)), and then the corresponding read address counter 151 is incremented. In the next read operation, 8 bit data is read from the incremented address.

At the falling edge of the clock signal RACLK to L level, the inverted Q output signal of the D flip-flop circuit 18 is fed back to itself. Consequently, the switching signal SW becomes L level (FIG. 4 (o)). When the switching signal SW is at L level, the output signal of the EX-NOR 22 gate is at H level, and the second write request signal WREQ2 is at L level. Consequently, the output signals of both AND gates 21 and 23 are at L level. This permits the signal V sent from the OR gate 24 to the D flip-flop circuit 25 to be at L level.

When the timing judging signal JUDGE becomes L level in this state, the read acknowledge signal RACK is outputted and sent to the DA converter 5, because the read enable signal REB is still at L level. In the DA converter 5, the read request signal RREQ is reset, as shown in FIG. 4 (a). Since the read request signal RREQ and signal V are inputted to the D flip-flop circuits 20 and 25 respectively, at the rising edge of the timing judging signal JUDGE, the inverted Q output signals of both D flip-flop circuits 20 and 25 are at H level. Consequently, both read and write enable signals REB and WEB are at H level to finish the read operation.

When read and write operations are simultaneously requested during reproduction in the normal direction, the DRAM 2 is accessed first for the write operation prior to the read, and then the read operation is carried out after the write.

[2] Reverse Direction

The operation of this embodiment is further described by referring to FIG. 5 when the reproducing direction is reverse. The direction signal UPDOWN is at H level, as shown in FIG. 5. When both the write request signal WREQ2 and read request signal RREQ are at H level, a high level signal is applied to the D terminal of the D flip-flop circuit 20. The switching signal SW remains at L level as in the initial state (FIG. 5 (o)). The output signal of the EX-NOR gate 22 is at L level. This permits the output signals of the AND gates 21 and 23 to be at L level. The output signal V of the OR gate 24 is at L level, as shown in FIG. 5 (h).

When the timing judging signal JUDGE is applied to the D flip-flop circuits 20 and 25 (FIG. 5 (e)), the inverted Q output signal of the D flip-flop circuit 20 becomes L and the Q output signal of the D flip-flop circuit 25 becomes L level in response to the rising edge of the timing judging signal. Consequently, the read enable signal REB from the OR gate 26 is at L level, as shown in FIG. 5 (f). The inverted Q output signal of the D flip-flop circuit 25, write enable signal WEB, remains at H level.

When the read enable signal REB becomes L level, the output signal REF of the AND gate 12 becomes L level. The RAS/CAS generating circuit 13 asserts the RAS and CAS signals, as shown in FIG. 5 (k). This enables access to the DRAM 2. At this time, the content of the read address counter 151 in the address counter 15 is outputted in response to the read enable signal REB at L level. Consequently, the first read address set by the DSP 4 is outputted onto the address bus 30.

The read operation is carried out prior to the writing in the DRAM 2. The shift register sends data to DSP 4, as described before. During this read operation, the 8 bit counter generates a pulse when it reads one byte of data from the DRAM 2 by asserting CAS signals eight times. The pulse is inverted by the NOR gate 11, and inputted to the address counter 15 as the clock signal RACLK (FIG. 5 (m)), then the corresponding read address counter 151 is incremented. In the next read operation, 8 bit data are read from the incremented address.

At the falling edge of the clock signal RACLK, the inverted Q output signal of the D flip-flop circuit fed back to itself. Consequently, the switching signal SW becomes H level (FIG. 5 (o)). When the switching signal SW is at H level, the output signal of the EX-NOR becomes H level, because the direction signal UPDOWN is at H level. At this time, the second write request signal WREQ2 remains at H level. Consequently, the output signal of the AND gate 23 is at H level. This permits the signal V sent from the OR gate 24 to be at H level.

When the timing judging signal JUDGE becomes L level in this state, the read acknowledge signal RACK is outputted and sent to the DA converter 5, because the read enable signal REB is still at L level. In the DA converter 5, the read request signal RREQ is reset, as shown in FIG. 5 (a). Since the read request signal RREQ and signal V are inputted to the D flip-flop circuits 20 and 25 respectively, at the rising edge of the timing judging signal JUDGE, the inverted Q output signal of the D flip-flop circuit 20 becomes H level, and that of the D flip-flop circuit 25 becomes L level. Consequently, the read enable signal REB becomes H level to finish the read operation, and the level of the write enable signal WEB is changed to L.

When the write enable signal WEB is at L level, the content of the write address counter 152 in the address counter 15 is sent onto the address bus 30. Simultaneously, the RAS/CAS generating circuit 13 generates RAS and CAS signals. The write operation which has been pending is initiated in the DRAM 2 by the RAS and CAS signals, as in the read operation. The shift register 44 sends data to the DRAM 2, as described above.

In the write operation, the 8 bit counter 14 generates a pulse when it reads one byte of data from the DRAM 2 by asserting CAS signals eight times. The pulse is inverted by the NAND gate 10, and inputted to the address counter 15 as the clock signal WACLK (FIG. 5 (n)), and then the corresponding write address counter 152 is incremented. In the next write operation, 8 bit data are read from the incremented address. When the content of the write address counter 152 coincides with that of the end address counter 153 after carrying out the write operation, the comparator 154 outputs the coincidence signal WAEND. The D flip-flop circuit 18 is reset by the coincidence signal WAEND, and then the switching signal SW becomes L level, as in the initial state.

At the falling edge of the clock signal WACLK, the inverted Q output signal of the D flip-flop circuit 18 is fed back to itself. Consequently, the switching signal SW becomes L level (FIG. 5 (o)). The latch circuit 43 is reset by the clock signal WACLK, and then the second write request signal WREQ2 becomes L level. When the switching signal SW is at L level, the output signal of the EX-NOR gate 22 becomes L level. At this time, the second write request signal WREQ2 is also at L level, and the output signals of both AND gates 21 and 22 are at L level. Consequently, the output signal V of the OR gate 24 is at L level. The read request signal RREQ is also at L level. When the timing judging signal JUDGE is applied in this state, the inverted Q output signals of both D flip-flop circuits 20 and 25 become H level. This permits both read and write enable signals to become H level to finish the write operation.

Figure 6:
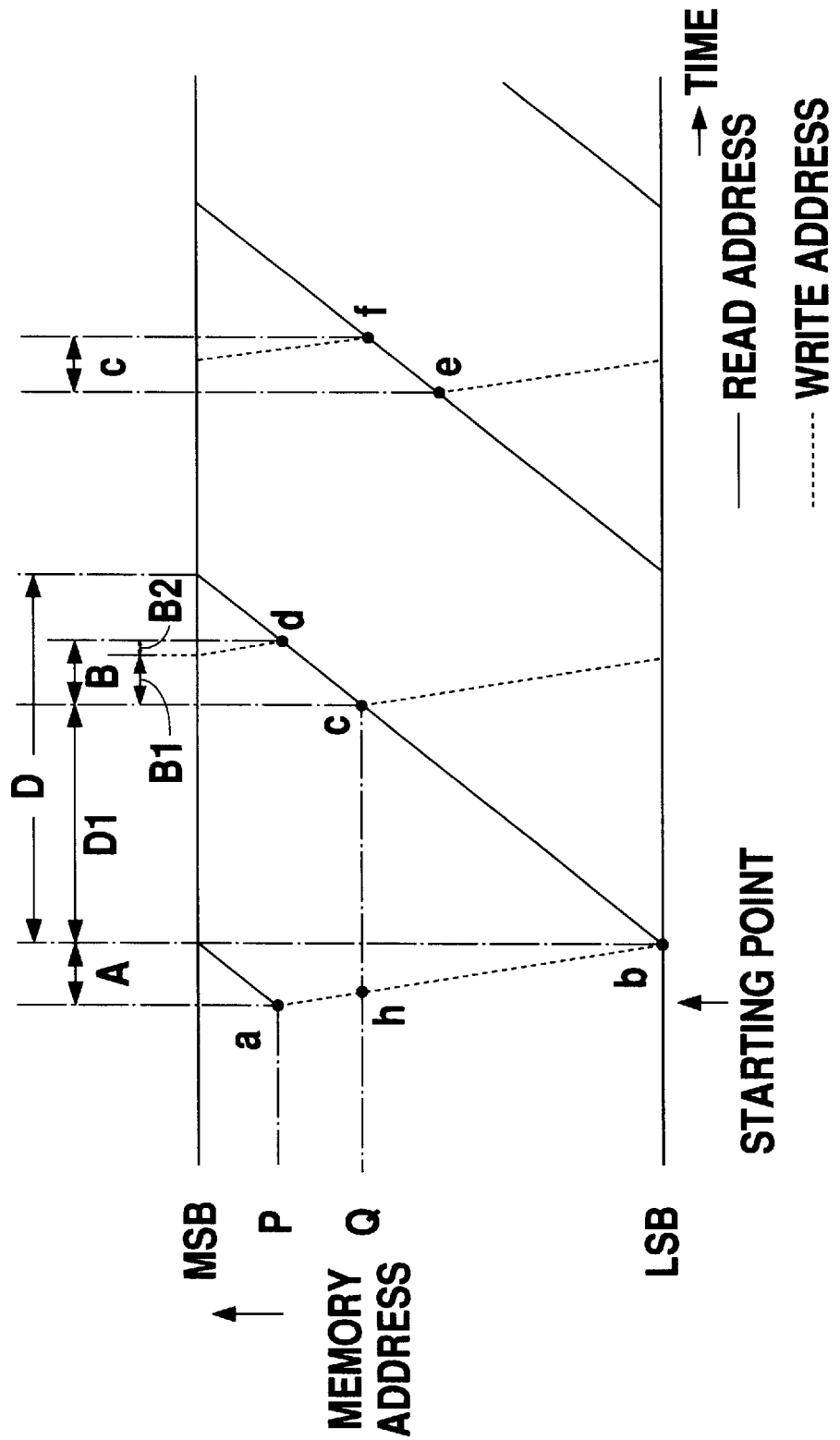
FIG. 6 shows a chart for describing orienting directions in which the reading and writing proceed in the addresses of a DRAM in reproduction in the reverse direction in accordance with a preferred embodiment of the present invention.

When read and write operations are simultaneously requested during reproduction in the reverse direction, the DRAM 2 is accessed first for the read operation prior to the writing, and then the write operation is carried out after reading. At points a, b, c, d, e and f in FIG. 6, the read and write operations are simultaneously requested, and the read operation is carried out prior to the writing. This can eliminate discontinuous points of sound data, and realizes the reproduction of continuous sounds.

When either the read or write operation is requested, only the requested operation is carried out.

[3] Reproduction at an ultrahigh speed

The operation of this embodiment is further described when the reproducing is carried out at an ultrahigh speed in the reverse direction. When read and write operations are simultaneously requested, either the read or write operation is first carried out according to the priority, and then the other is carried out successively. In the interval of the write operations, each of the read and write operations must be done. No problems occur in reproduction at a speed two to five times higher than normal. However, the following problems arise when reproduction is performed at a speed nine or more times higher than normal:

The read operation is periodically requested at a low frequency corresponding to the normal reproducing speed. The write operation is periodically requested at an ultrahigh frequency corresponding to the very high reproducing speed. While one write operation is carried out after a read operation prior to writing, the next write operation is likely to be requested. If a request for the next write operation is accepted, the data being written is immediately overwritten with new data. If the request for the next write operation is ignored, the continuity of sound data is lost.

A receiver of a request for the write operation sends the write acknowledge signal ACK. A request for the next write operation is not permitted to be outputted before a requester of the write operation receives the write acknowledge signal ACK. When the write acknowledge signal ACK is outputted after completion of the write operation by the receiver, the requester cannot output requests for the write operation at an ultrahigh frequency corresponding to the reproducing speed, preventing from reproduction at an ultrahigh speed.

The present invention realizes good sound reproduction when the video tape is scanned even in the reverse direction at a speed nine or more times higher than normal. As described before, the read operation is carried out first when the read and write operations are simultaneously requested. After the read operation ends, the read acknowledge signal RACK is outputted to the DA converter 5. Consequently, the read request signal RREQ becomes L level, and then the write operation is carried out.

The read acknowledge signal RACK is generated after finishing the read operation, whereas the write acknowledge signal WACK, outputted in response to the write request signal WREQ, is set to be generated before finishing the write operation. The write request signal WREQ at H level passes through the AND gate 40, and then applied to the D flip-flop circuit 42 at the rising edge of the CAS signal applied though the AND gate 41 (FIG. 5 (l)). The inverted Q output signal of the D flip-flop circuit 42, the write acknowledge signal WACK, becomes L level at the rising edge of the CAS signal (FIG. 5 (p)), and then sent to the AD converter 1.

Figure 7:
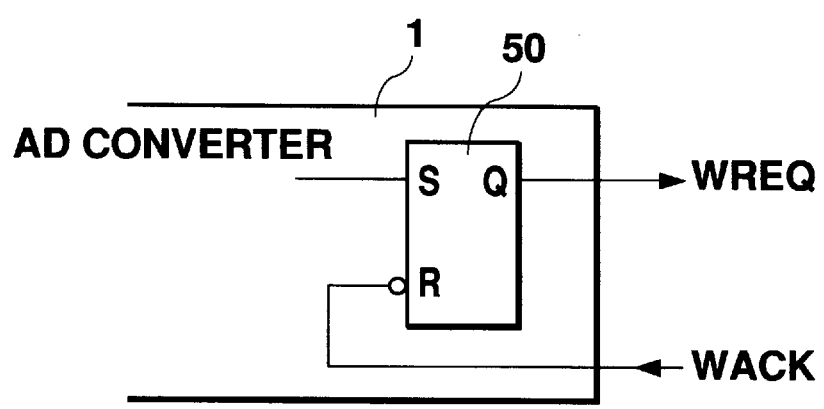
FIG. 7 shows detailed circuitry of the main section of an AD converter in accordance with a preferred embodiment of the present invention.

In the AD converter 1, an RS flip-flop circuit 50 for generating the write request signal WREQ is included, as shown in FIG. 7. The RS flip-flop circuit 50 is set by a request indicating signal RQT, and reset by the write acknowledge signal WACK inputted from the DRAM controller 3. When the write acknowledge signal WACK becomes L level (FIG. 5 (p)), the write request signal WREQ becomes L level (FIG. 5 (b)). In this state, the AD converter 1 can generate the next write request signal WREQ at any time. The AD converter 1 can output the next write request signal WREQ before finishing the write operation during reproduction at an ultrahigh speed, shown by a broken line in FIG. 5 (b).

If the write acknowledge signal WACK is set to be asserted after finishing the operation like the read acknowledge signal RACK, the RS flip-flop circuit 50 in the AD converter 1 causes the request indicating signal RQT to be at H level in order to generate the next write request signal WREQ before resetting the RS flip-flop circuit 50. This causes the write request signal WREQ to remain at H level, preventing the DRAM controller from judging whether the next write request occurs.

As shown by a broken line in FIG. 5 (b), the next write request signal WREQ is applied to the AND gate 40 when it is inputted to the DRAM controller 3. Since a inverted Q output signal at L level is applied to the AND gate 40 from the latch circuit 43 as a prohibit signal, a preset signal is not outputted to the register 44, and data is not preset. The write acknowledge signal WACK is not outputted, either. The write request signal WREQ remains at H level. Since the write enable signal WEB is still at L level in this state, the write operation is in progress, and data preset by the previous write request are being shifted in the shift register 44 using the CAS signals inputted from the OR gate 45 as the clock signals.

After finishing the shift operation, the clock signal WACLK becomes L level (FIG. 4 (*n*)), and then the latch circuit 43 is reset. The inverted Q output signal of the latch circuit 43 becomes H level, resetting the prohibit signal. A write request signal WREQ at H level is outputted through AND gate 40, as a result of which new data corresponding to the next write request are preset in the shift register via the data bus 19. An output signal at H level from the AND gate 40 is inputted to the D flip-flop circuit 42 at the rising edge of the next CAS signal. The Q output signal of the D flip-flop circuit 42 becomes H level, and then the write acknowledge signal WACK becomes L level, as shown in FIG. 5 (*p*). The write acknowledge signal WACK is sent to the AD converter 1. As shown in FIG. 5 (*b*), the write request signal WREQ becomes L level after being at H level for a period prolonged by a pending time. An output signal at H level from the D flip-flop circuit 42 is inputted to the latch circuit 43 as a latch signal. An output signal of the latch circuit 43, the second write request signal WREQ2, becomes H level, as shown in FIG. 4 (*c*). As the data previously inputted to the shift register 44, input data are repeatedly shifted in the shift register 44 to write data into the DRAM.

In contrast, the write operation is carried out after finishing the write operation when the reproduction is carried out at an ultrahigh speed in the normal direction. As shown by a broken line in FIG. 4, the latch circuit has already been reset when the next write request is inputted. A invertedsignal of the second write request signal WREQ2 from the latch circuit 43 is at H level. An output signal of the AND gate 40 at H level is immediately generated to preset new data in the shift register 44. At the rising edge of the CAS signal, the write acknowledge signal WACK immediately becomes L level, and the second write request signal WREQ2 at H level. The read enable signal REB becomes H level at the same timing when the write enable signal WEB returns to L level. The write operation is initiated after the read. The content of the shift register 44 is shifted during a period of the write operation.

During reproduction at an ultrahigh speed in the reverse direction, the presetting of data corresponding to the next write request in the shift register 44 is suspended, whereas during reproduction in the normal direction, the presetting of data is carried out immediately.

According to the present invention, the read or write operation is appropriately selected in response to the sequence of input sound data being accessed in the memory when the read and write operations are simultaneously requested. This realizes reproduction of continuous sounds, and makes it possible to eliminate noise due to discontinuous points of sound data.

While there has been described what is at present considered to be a preferred embodiment of the present invention, it will be understood that various modifications may be made thereto, and it is intended that the appended claims cover all such modifications as fall within the true spirit and scope of the present invention.

I claim:

1. A read/write control circuit for a memory storing sound data which is included in a sound recording/reproducing device comprising:

a read/write judging circuit which receives read and write request signals and a direction signal indicating whether a sequence of input sound data inputted into the memory is normal or reverse, wherein the read/write judging circuit refers to the direction signal when both the read and write request signals simultaneously become active, gives priorty to a write operation in the memory when the sequence is normal by asserting a write enable signal, and gives priority to a read operation in the memory when the sequence is reversed by asserting a read enable signal.

2. A read/write control circuit in accordance with claim 1 further comprising:

a read address counter for holding a read address for the memory; and a write address counter for holding a write address for the memory, the read and write address counters being incremented or decremented in the read and write address according to the address orienting direction respectively, values in the read and write address counters being outputted to an address bus during the read and write operations, respectively, the memory being accessed according to the read and write addresses.

3. A read/write control circuit in accordance with claim 1 further comprising:

a switching signal generating circuit for generating a switching signal, the polarity of which is inverted every time the read and write operations are performed based on the write and read enable signals, the read/write judging circuit referring to the switching signal when both read and write request signals simultaneously become active, then asserting the rest of two enable signals in order to perform the rest of two operations when the read or write operation to which the priority has been given is completed.

4. A read/write control circuit in accordance with claim 1, wherein the read/write judging circuit further comprises:

a switching signal generating circuit for generating a switching signal, the polarity of which is inverted every time the read and write operations are performed based on the write and read enable signals;

a detecting circuit for detecting whether the direction signal coincides with the switching signal, and asserting a detection signal;

a write enable signal generating circuit for asserting a write enable signal at a predetermined timing when the write request arises without the read request arising and when the detection signal is asserted from the detecting circuit with the write request arising; and a read enable signal generating circuit for asserting a read enable signal at a predetermined timing when the read request arises without the write enable signal being asserted.

5. A read/write control circuit in accordance with claim 3 further comprising:

a write address counter for holding a write address;

an end address counter for holding an end address at which the write operation ends; and a comparing circuit for comparing a value held in the write address counter with a value held in the end address counter, wherein the switching signal generating circuit is reset to initialize the switching signal when the write address reaches the end address.

6. A read/write control circuit in accordance with claim 1 further comprising:

a serial/parallel converting circuit for converting serial data read from the memory to parallel data; and a parallel/serial converting circuit for converting parallel data to be written into the memory to serial data, wherein the serial/parallel converting circuit comprises a shift register to which data read from the memory is inputted and which shifts the data bits every time the read operation is performed, and the parallel/serial converting circuit comprises a shift register to which data to be written to the memory is inputted and which shifts the data bits every time the write operation is performed.

7. A read/write control circuit in accordance with claim 2, further comprising:

an acknowledge signal generating circuit for immediately asserting a write acknowledge signal to a requester for the write operation; and a prohibit signal generating circuit for prohibiting the write acknowledge signal from being asserted by the acknowledge signal generating circuit throughout the write operation once the write operation starts.

8. A read/write control circuit in accordance with claim 7 further comprising:

a shift register for converting input parallel data to serial data and sending the serial data to the memory;

a first gate circuit for supplying a clock signal to the shift register while the write enable signal is being asserted; and a second gate circuit in which the write request signal is applied to its data input terminal and an output signal of which is sent to the shift register as a preset signal, wherein the acknowledge signal generating circuit receives an output signal of the second gate circuit to assert the write acknowledge signal, and the prohibit signal generating circuit sends the prohibit signal to the other terminal of the second gate circuit in response to the assertion of the write acknowledge signal and resets the prohibit signal in response to completion of the write operation.

9. A read/write control circuit for previously asserting one of read and write enable signals to which priorty is given, successively the other enable signal when read and write request signals are simultaneously inputted, the read/write control circuit comprising:

an acknowledge signal generating circuit for immediately asserting a write acknowledge signal to a requester for a write operation;

a prohibit signal generating circuit for prohibiting the write acknowledge signal from being asserted by the acknowledge signal generating circuit throughout the write operation once the write operation starts;

a shift register for converting input parallel data to serial data and sending the serial data to a memory;

a first gate circuit for supplying a clock signal to the shift register while the write enable signal is being asserted; and a second gate circuit having the write request signal applied to its data input terminal and providing an output signal to the shift register as a preset signal, wherein the acknowledge signal generating circuit receives an output signal of the second gate circuit to assert the write acknowledge signal, and the prohibit signal generating circuit sends the prohibit signal to an other terminal of the second gate circuit in response to the assertion of the write acknowledge signal and resets the prohibits signal in response to completion of the write operation, wherein the acknowledge signal generating circuit comprises a flip-flop circuit in which the output signal of the second gate circuit is applied to its data input terminal and the clock signal is applied to its clock terminal while the prohibit signal is inactive, and the prohibit signal generating circuit comprises a latch circuit in which an input terminal voltage is fixed at a predetermined level and the output signal of the flip-flop circuit is applied as a latch signal.

\* \* \* \* \*